United States Patent [19]

White et al.

[11] Patent Number: 4,800,365

[45] Date of Patent: Jan. 24, 1989

[54] CMOS DIGITAL-TO-ANALOG CONVERTER CIRCUITRY

[75] Inventors: Robert L. White; Frederick J. Highton; Kazuo Ito, all of Tucson, Ariz.; Gary L. Miller, Santa Clara, Calif.

[73] Assignee: Burr-Brown Corporation, Tucson, Ariz.

[21] Appl. No.: 62,774

[22] Filed: Jun. 15, 1987

[51] Int. Cl.$^4$ .............................................. H03M 1/06
[52] U.S. Cl. .................................. 341/119; 307/310; 307/491; 341/136; 341/154
[58] Field of Search ............... 307/310, 491, 501, 571, 307/572; 340/347 CC, 347 DA

[56] References Cited

U.S. PATENT DOCUMENTS

| | | | |
|---|---|---|---|
| 4,100,437 | 7/1978 | Hoff, Jr. ............................. | 307/297 |
| 4,267,550 | 5/1981 | Cecil ............................. | 340/347 DA |
| 4,419,594 | 12/1983 | Gemmell et al. ..................... | 307/297 |
| 4,424,461 | 1/1984 | Taguchi et al. ..................... | 307/491 |
| 4,464,588 | 8/1984 | Wieser ............................. | 307/297 |
| 4,477,737 | 10/1984 | Ulmer et al. ........................ | 307/297 |
| 4,479,708 | 10/1984 | Tokuda ............................. | 354/427 |
| 4,494,019 | 1/1985 | Brown ............................. | 307/491 |
| 4,573,039 | 2/1986 | Suzuki et al. ................. | 340/347 DA |
| 4,591,743 | 5/1986 | Kung ............................. | 307/491 |

Primary Examiner—William M. Shoop, Jr.
Assistant Examiner—Richard K. Blum
Attorney, Agent, or Firm—Cahill, Sutton & Thomas

[57] ABSTRACT

A CMOS digital-to-analog converter includes a modified R-2R resistive ladder network connected to 16 pairs of bit switches responsive to the various digital inputs to produce an internal analog voltage representative of the digital input. Each pair of bit switches includes an N-channel MOSFET and a P-channel MOSFET. The on resistance of the P-channel MOSFET is adjusted to precisely match that of the N-channel MOSFET by driving the gate of each P-channel MOSFET with the output of a CMOS inverter referenced between $V_{CC}$ and a reference voltage that is adjusted to cause the on resistances of a P-channel "monitor" MOSFET and an N-channel "monitor" MOSFET to be equal. A reference voltage is generated by a circuit that generates a temperature-invariant source current from a $V_{BE}$ difference between first and second transistors, causes part of it to flow through first, second, and third resistors, the third resistor having a voltage across it established by the $V_{BE}$ voltage of a transistor and having a predetermined negative temperature coefficient, the second and third resistors being composed of nichrome, the first resistor being lightly doped P-type material the resistance of which has a positive temperature coefficient.

24 Claims, 8 Drawing Sheets

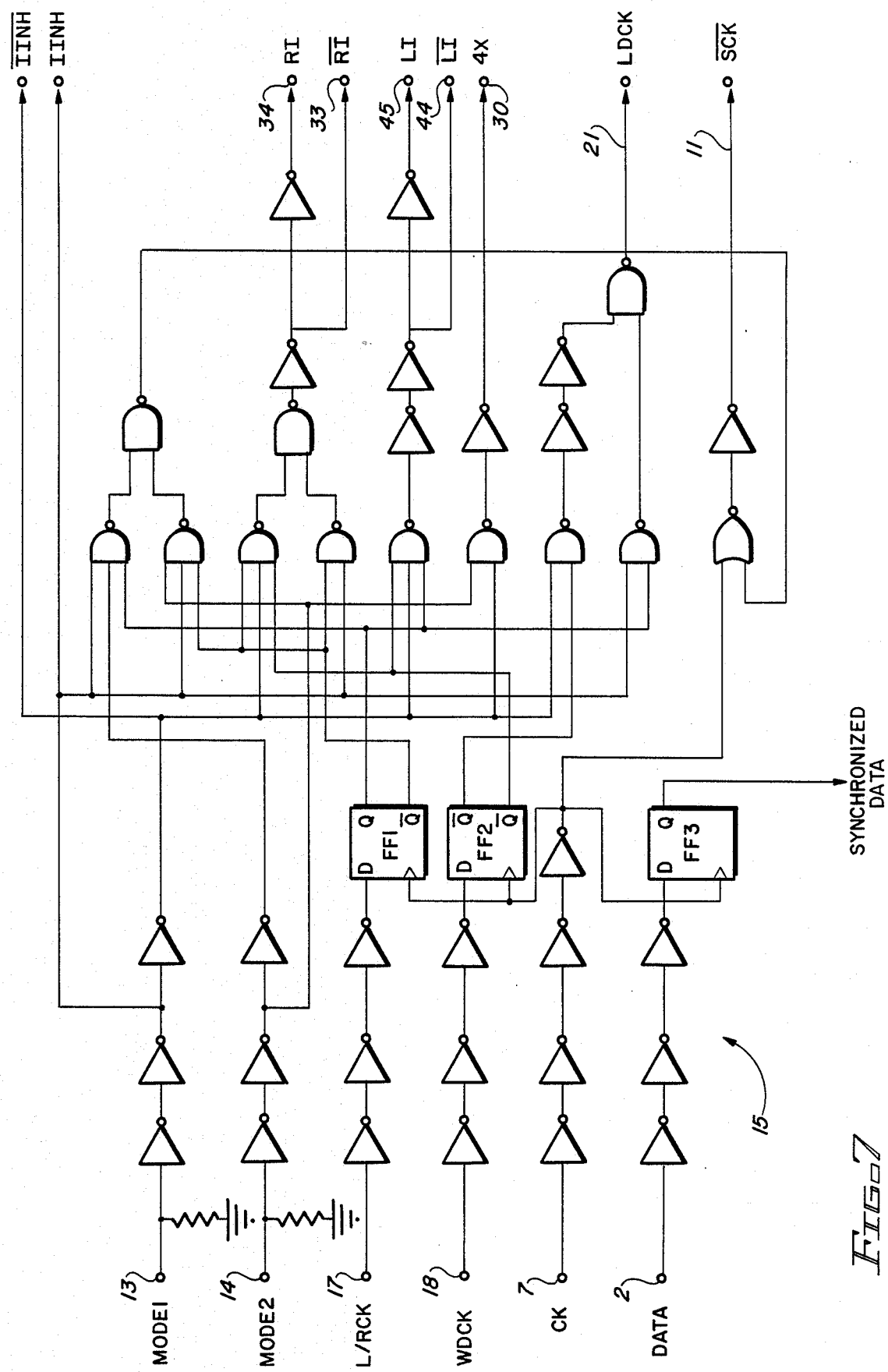

Fig. 9

CMOS DIGITAL-TO-ANALOG CONVERTER CIRCUITRY

BACKGROUND OF THE INVENTION

The invention relates to digital-to-analog converters, and more particularly to CMOS circuitry for digital-to-analog converters.

A digital-to-analog converter circuit useful in decoding digitized audio signals is described in copending allowed patent application "LEVEL SHIFTING CIRCUITRY FOR SERIAL-TO-PARALLEL CONVERTER", Ser. No. 829,707, filed Feb. 13, 1986, incorporated herein by reference. While the circuit described in that patent application has been commercially very successful for making compact disk players, it requires a +5 volt power supply and a −5 volt power supply. Bipolar integrated circuit technology is utilized. It would be desirable to provide an even lower cost, lower power digital-to-analog converter that is useful in making high fidelity audio products. However, achieving an acceptably low level of harmonic distortion in a serial digital to analog converter implemented using CMOS technology and dissipating sufficiently low amounts of power to be acceptable for portable, battery-powered high fidelity audio products presents an extremely difficult challenge. The requirement of the harmonic distortion specifications can be translated into a requirement for 13 bit linearity. The highest previously achievable linearity of a CMOS DAC is believed to be 11 or 12 bits. When CMOS technology is used to implement DACs with accuracy greater than about ten to eleven bits, achieving the desired accuracy occurs at the expense of making very large geometry N-channel and P-channel MOSFETS. For the particular type of DAC required for high fidelity audio products, a relatively fast DAC settling time is required. The non-linearity of CMOS amplifiers and the need to have summing junctions between ground and +5 volts presents considerable difficulty when prior CMOS circuits are used as the basis of an improved design to meet the above indicated objectives. More accurate, temperature invariant reference voltages are required, which heretofore have been unachievable with CMOS circuit technology operating from a single 5 volt power supply. The problem of precisely matching N-channel and P-channel bit switch MOSFETs in voltage dividing resistive ladders which much be utilized to achieve the required 13 bits of linearity has not been solved for a 5 volt CMOS DAC prior to the present invention. It should be appreciated that circuit techniques and connections that have been successful in solving various problems in bipolar integrated circuit technology often are not directly applicable to CMOS integrated circuit technology, particularly when objectives of low cost, single 5 volt power supply operation and high frequency response need to be met.

SUMMARY OF THE INVENTION

Accordingly, it is an object of the invention to provide a serial digital to analog converter using CMOS technology, capable of operating from a single 5 volt power supply with very low power dissipation and having sufficient accuracy and linearity to provide a low level of harmonic distortion that is suitable for high fidelity compact disc players and the like.

It is another object of the invention to provide accurate bit switching circuitry for a voltage divider ladder for a CMOS DAC.

It is another object of the invention to provide circuitry and a method for ensuring that corresponding N-channel and P-channel bit switch MOSFET channel resistances are precisely matched over a normal range of temperature variation and a normal range of manufacturing process parameter tolerances.

It is another object of the invention to provide an amplifier for use in a CMOS DAC that provides high frequency response and avoids zeros in the frequency response at low frequencies and amplifier instability caused thereby.

It is another object of the invention to provide a modified R-2R resistive ladder that minimizes the sizes of the bit switches.

It is another object of the invention to provide an accurate reference voltage circuit usable in a CMOS manufacturing process.

It is another object of the invention to provide a serial DAC useful in compact disc player applications and capable of functioning as a left channel DAC, a right channel DAC, or an alternating channel DAC.

Briefly described, and in accordance with one embodiment thereof, the invention provides bit switch adjustment circuitry for a CMOS digital-to-analog converter that includes a resistive voltage divider ladder network and a P-channel bit switch MOSFET having its drain connected to a terminal of a ladder resistor, its source connected to a first supply voltage and its gate connected to the output of a first inverter, and an N-channel bit switch MOSFET having its drain connected to the terminal of the ladder resistor, its source connected to a first reference voltage conductor, and its gate connected to the output of a second inverter. The bit adjustment circuitry causes the on channel resistance of the P-channel and N-channel bit switch MOSFETs to be precisely equal. The bit adjustment circuitry produces a second reference voltage on a second reference voltage conductor and includes a connection of a source of an N-channel MOSFET of the first inverter to the second reference voltage conductor and a connection of the drain of the N-channel MOSFET to the gate of the P-channel bit switch MOSFET. A monitor circuit responsive to the second reference voltage produces a predetermined monitor voltage at a monitor conductor when the second reference voltage has a value that causes the first inverter output voltage to turn on the P-channel bit switch MOSFET so that its on channel resistance precisely matches the on channel resistance of the N-channel bit switch MOSFET. In one described embodiment of the invention, the monitor voltage is measured and used to control laser trimming of a nichrome resistor in the bit adjustment circuit to adjust the value of the monitor voltage to indicate that the on channel resistance of a P-channel monitor transistor is equal to the on channel resistance of an N-channel monitor resistance connected in series relationship to the P-channel monitor MOSFET, at which time the geometry ratios of the P-channel and N-channel monitor MOSFETs match those of the P-channel and N-channel bit switch MOSFETs, respectively.

The first reference voltage is generated in response to a third reference voltage produced by a circuit that includes a constant current source including a temperature invariant resistor connected between the emitters of first and second NPN transistors having a common base connection. A first nichrome resistor is connected between the emitter and base of the first NPN transistor. A second nichrome resistor is connected between the base of the first NPN transistor and one terminal of a third semiconductor resistor, the other terminal of which is connected to the positive supply voltage conductor. The third reference voltage is produced on the base of the first NPN transistor. The circuit operates so that the negative temperature coefficient of the VBE voltage of the first transistor results in a current having the same negative temperature coefficient flowing through the first, second, and third resistors. The temperature coefficient of the resistance of the semiconductor resistor is positive. Values of the second and third resistors are selected so that the combined incremental voltage drop across the second and third resistors with respect to temperature is zero. Second order affects are insignificant for the temperature range to which the DAC is subjected. The third reference voltage is amplified by a high gain reference amplifier, the output of which produces the first reference voltage. A large capacitor is connected to the output of the reference amplifier in such a manner that wire bonding resistance is added in series with the feedback resistance of the reference amplifier and the output resistance of the amplifier and prevents the wire bonding resistance from generating a zero in the frequency response of the reference amplifier which may occur at frequencies lower than the unity gain point of the reference amplifier. Mode control circuitry is provided which allows the DAC to be utilized as a single DAC producing both right channel and left channel analog signals, a left channel DAC, or a right channel DAC which delays clocking of digital inputs to the bit switches so that simultaneous conversion of left channel and right channel information can occur.

In the described embodiment of the invention, a modified R-2R resistor voltage divider ladder network is used wherein binary scaling of bit switch resistances is provided only for the first 10 bits of a 16 it ladder network. Increased values of series resistors and parallel resistors are used in the last 6 bits.

BRIEF DESCRIPTION OF THE DRAWINGS

FIG. 7 is a logic diagram of the mode logic circuit included in the DAC of FIG. 1.

FIG. 9 is a partial circuit diagram useful in explaining the modified R-2R resistive divider ladder of the present invention.

DETAILED DESCRIPTION OF THE PREFERRED EMBODIMENTS OF THE INVENTION

Figure 1:
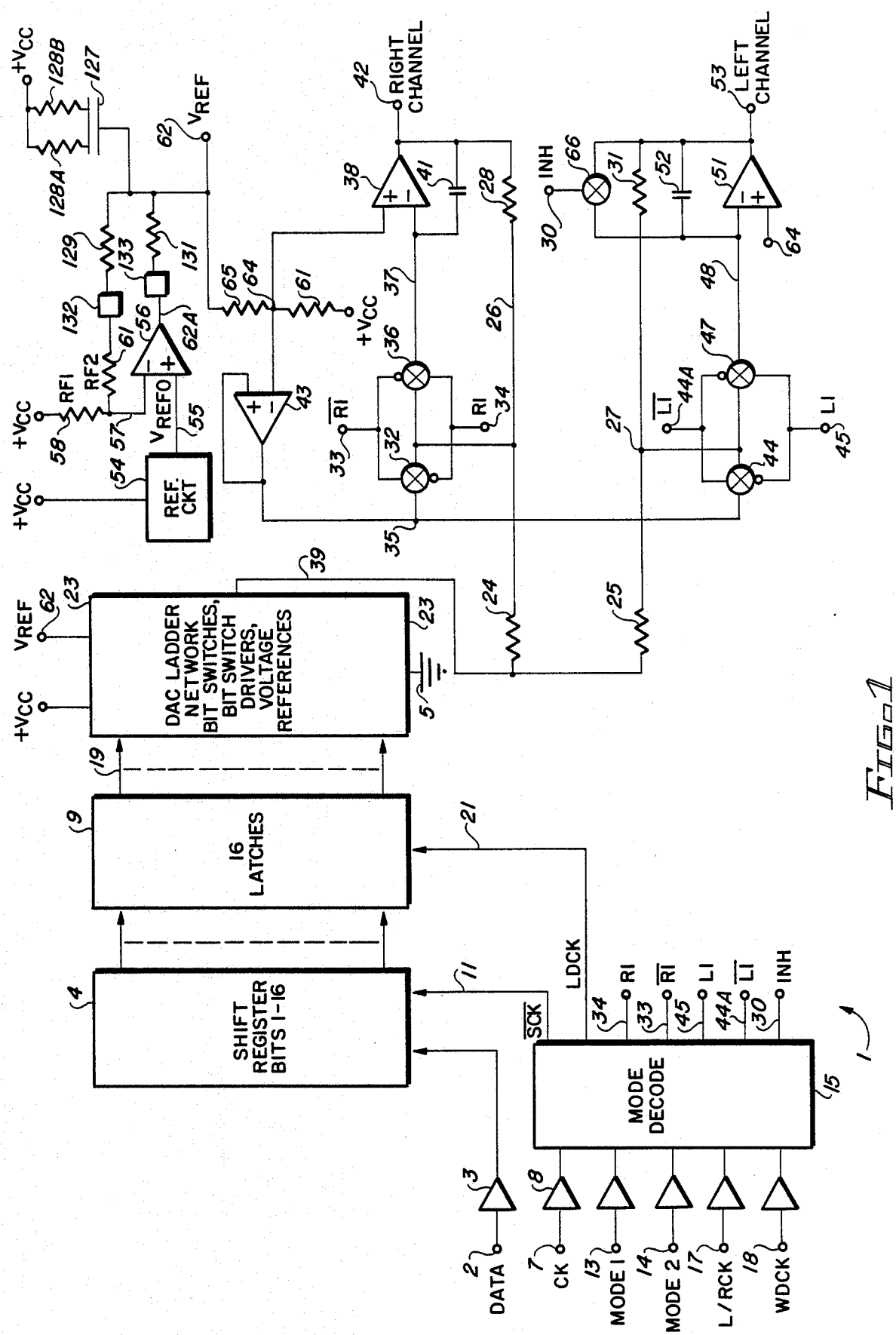
FIG. 1 is a schematic block diagram of a serial 16 bit CMOS DAC of the present invention.

Referring to FIG. 1, 16-bit DAC (digital-to-analog converter) 1 receives serial data on input 2, which is connected to a non-inverting CMOS buffer 3, the output of which is connected to the input of a 16-bit CMOS shift register 4. As indicated in the DATA waveforms of FIGS. 8A and 8B, the serial data is in the form of 16 bits of right channel data, followed by a delay, followed by 16 bits of left channel data. Each of the bits 1 through 16 of shift register 4 can be implemented by means of a conventional negative-edge-triggered CMOS clocked D-type flip-flop circuit which can be provided readily by those skilled in the art. The outputs of the bits of shift register 4 are respectively connected to corresponding inputs of a 16-bit latch circuit 9. Each of the bits of latch circuit 9 can be implemented by means of a positive-edge-triggered D-type flip-flop circuit, which can be implemented easily by those skilled in the art. The outputs of each of bits 1 through 16 of latch circuitry 9 are coupled by 16 conductors 19 to corresponding inputs of circuitry 23, which includes a resistive voltage divider ladder network with 16 bit switches, 16 bit-switch drivers, and associated reference voltage circuitry shown in FIG. 3.

A clock input 7 (CK) is connected to an input of mode decode circuit 15, which, among other functions, applies a shift signal SCK* to the shift inputs of each of bits 1 through 16 of shift register 4. (Note that an asterisk (*) is used herein to designate the complements of logic signals.) Two mode control inputs 13 and 14 are connected by non-inverting buffers to two inputs of mode decode circuit 15, subsequently described. An L/RCK (left/right clock) signal is connected by a non-inverting buffer to an input of mode decode circuitry 15. A WDCK (word clock) input 18 is connected by a non-inverting buffer to an input of mode decode circuit 15 to provide input protection from electrostatic discharge.

An LDCK (load clock) signal on conductor 21 is connected to the clock input of each of the bits 1 through 16 of latch circuitry 9 to apply the logic levels contained in each of the latches to the corresponding inputs of circuitry 23. Mode decode circuit 15 generates the RI (right integrate), RI*, LI (left integrate), LI*, and INH (inhibit) signals on conductors 34, 33, 45, 44A, and 30, respectively.

The output of the resistive ladder in block 23 is connected to conductor 39, which is connected to the junction between resistors 24 and 25. The other terminal of resistor 24 is connected by conductor 26 to a terminal of resistor 28 and to the junction between two CMOS transmission gates 32 and 36. The other terminal of resistor 28 is connected to one terminal of capacitor 41 and to the output of an integrate and hold amplifier 38, shown in detail in FIG. 5. The negative input of integrate and hold amplifier 38 is connected by conductor 37 to the other terminal of capacitor 41 and to the other port of CMOS transmission gate 36. The other port of CMOS transmission gate 32 is connected by conductor 35 to the output and the negative input of a non-inverting buffer 43.

The P-channel gate electrode of CMOS transmission gate 32 and the N-channel CMOS gate electrode of transmission gate 36 are connected by conductor 34 to the RI output of mode decode circuit 15. The P-channel gate electrode of transmission gate 36 and the N-channel gate electrode of CMOS transmission gate 32 are connected by conductor 33 to the RI* output of mode decode circuit 15. The output of integrate and hold amplifier 38 is connected to the right channel output conductor 42 of DAC 1.

The positive input of non-inverting buffer 43 is connected by conductor 64 to the positive input of integrate and hold amplifier 38, and also to the positive input of a second integrate and hold amplifier 51, the output of which is connected to a left channel output conductor 53.

Conductor 64 is coupled by resistor 63 to $V_{CC}$ and by resistor 65 to a conductor 62 on which a reference voltage $V_{REF}$ is produced. Conductor 62 is connected to a reference voltage input of circuitry 23. Conductor 62 also is connected by a roughly 0.1 ohm wire bonding resistance 131 to a bonding pad 133, which is connected by conductor 62A to the output of reference amplifier 56. Conductor 62 is connected to another 0.1 ohm wire bonding resistance 129 to another bonding pad 132, which is connected by $R_{F2}$ resistor 61 to the negative input of reference amplifier 56 and to one terminal of $R_{F1}$ feedback resistor 58, the other terminal of which is connected to $V_{CC}$. The purpose of this connection with bonding pads 131 and 132 will be described with reference to FIG. 5.

The positive input of reference amplifier 56 is connected by conductor 55 to the output of reference voltage circuit 54, which produces a basic reference voltage $V_{REF0}$ on conductor 55. Circuit 56 is shown in detail in FIG. 5, and circuit 54 is shown in detail in FIG. 4.

The second terminal of resistor 25 is connected by conductor 27 to the junction between CMOS transmission gates 44 and 47 and also to one terminal of resistor 31. The other terminal of resistor 31 is connected to the output conductor 53 of integrate and hold amplifier 51, to one terminal of CMOS transmission gate 66 and to one terminal of capacitor 52. The other terminal of capacitor 52 is connected by conductor 48 to the other terminal of CMOS transmission gate 47 and to the other terminal of CMOS transmission gate 66. The gate of transmission gate 66 is connected to the INH conductor 30 of mode decode circuit 15.

The P-channel control electrode of CMOS transmission gate 47 and the N-channel control electrode of CMOS transmission gate 44 are connected by conductor 44A to the LI* output of mode decode circuit 15. The P-channel control electrode of CMOS transmission gate 44 and the N-channel control electrode of CMOS transmission gate 47 are connected by conductor 45 to the LI output of mode decode circuit 15.

Next, the resistive ladder network and switching driver circuitry 23 will be described with reference to FIGS. 2 and 3.

Figure 2:
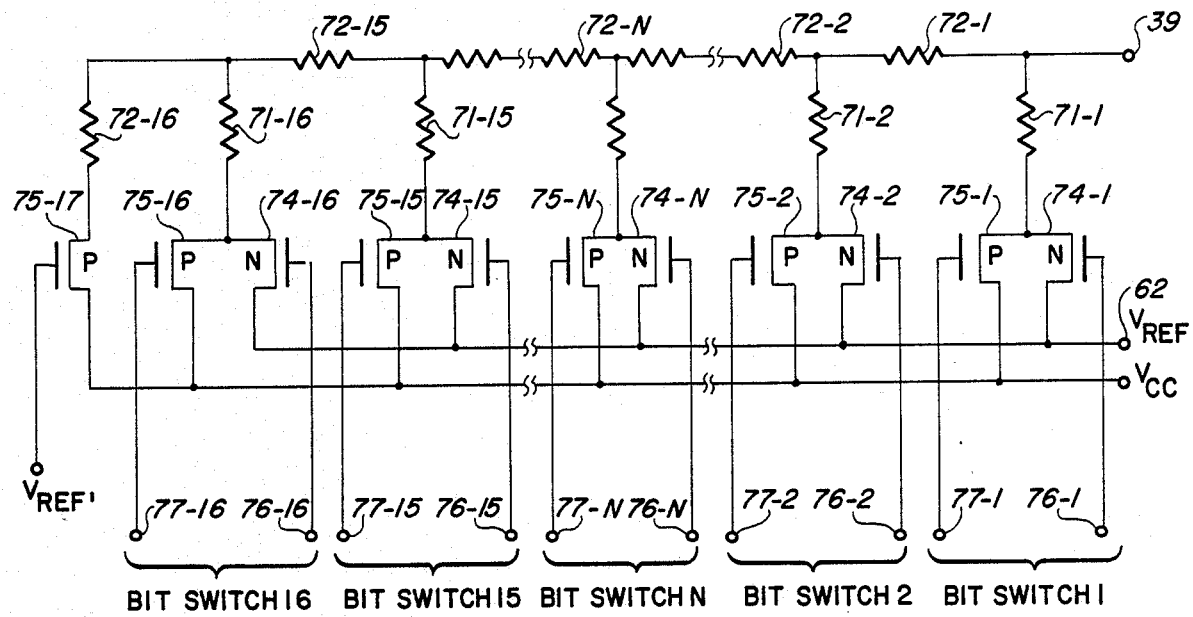
FIG. 2 is a partial circuit diagram of the voltage ladder included in block 23 of FIG. 1 and N-channel MOSFET and P-channel MOSFET bit switches associated therewith.

In FIG. 2, a 16-bit resistive voltage divider network is shown, including 16 bit switches each including a P-channel MOSFET 75 and an N-channel MOSFET 74. The above mentioned analog output voltage conductor 39 is connected to the output of the resistive ladder network. As those skilled in the art will recognize, the resistive ladder is a modified ladder network of the R-2R type in which each of the parallel branches the resistors 71-1, 71-2,...71-10 has a value of 2R and each of the series resistors 72-1, 72-2,...72-10 has a value equal to R. In the present case, each of the 2R resistors has a value of 20 kilohms and each of the R resistors has a value of 10 kilohms. For bits 11-16, the conventional R-2R structure is modified so that resistors 71-11 through 71-16 each have a value of 22.2 kilohms, and series resistors 72-11 through 72-15 have a value of 12.8 kilohms, and resistor 71-17 has a value of 22.2 kilohms. This modified structure avoids the need for the width-to-length ratio of each of the bit switch MOSFETs for bits 11-16 to be doubled for successively less significant bits of the ladder. It should be appreciated that relatively insignificant amounts of metal conductor resistance can be ignored for the purposes of the present description.

The lower end of each resistors 71-1, 71-2, . . . 71-17 is connected to the drain of a N-channel switch MOSFET 74-1, 74-2, . . . 74-16, respectively, the source electrode of which is connected to $V_{REF}$. The lower end of each of the resistors 71-1 through 71-16 also is connected to the drain of a P-channel bit switch MOSFET 75-1, 75-2, . . . 75-16, the source electrode of which is connected to $+V_{CC}$ volts. The gate electrodes of the N-channel bit switch MOSFETs 74-1, 74-2, etc. are connected to the outputs of N-channel bit switch driver circuits such as 84A in FIG. 3 by means of conductors 76-1, 76-2, etc. The gate electrodes of the P-channel bit switch MOSFETs 75-1, 75-2, etc. are connected by conductors 77-1, 77-2, etc. to the outputs of P-channel bit switch driver circuits 84B shown in FIG. 3. Note that the N-channel bit switches 74-1, 74-2, etc. are collectively referred to by reference numeral 74, their gate electrodes 76-1, 76-2, etc. are referred to collectively by reference numeral 76, and so forth. In FIG. 2, resistor 72-16 has its lower terminal connected to the drain of P-channel dummy switch MOSFET 75-17, the gate of which is connected to $V_{REF}$.

Those skilled in the art will recognize that the above resistive ladder network and bit switches function as an analog voltage divider circuit which can produce a binary output voltage on conductor 39 that represents the 16-bit digital input applied to the gate electrodes of the bit switch MOSFETs.

Figure 9:
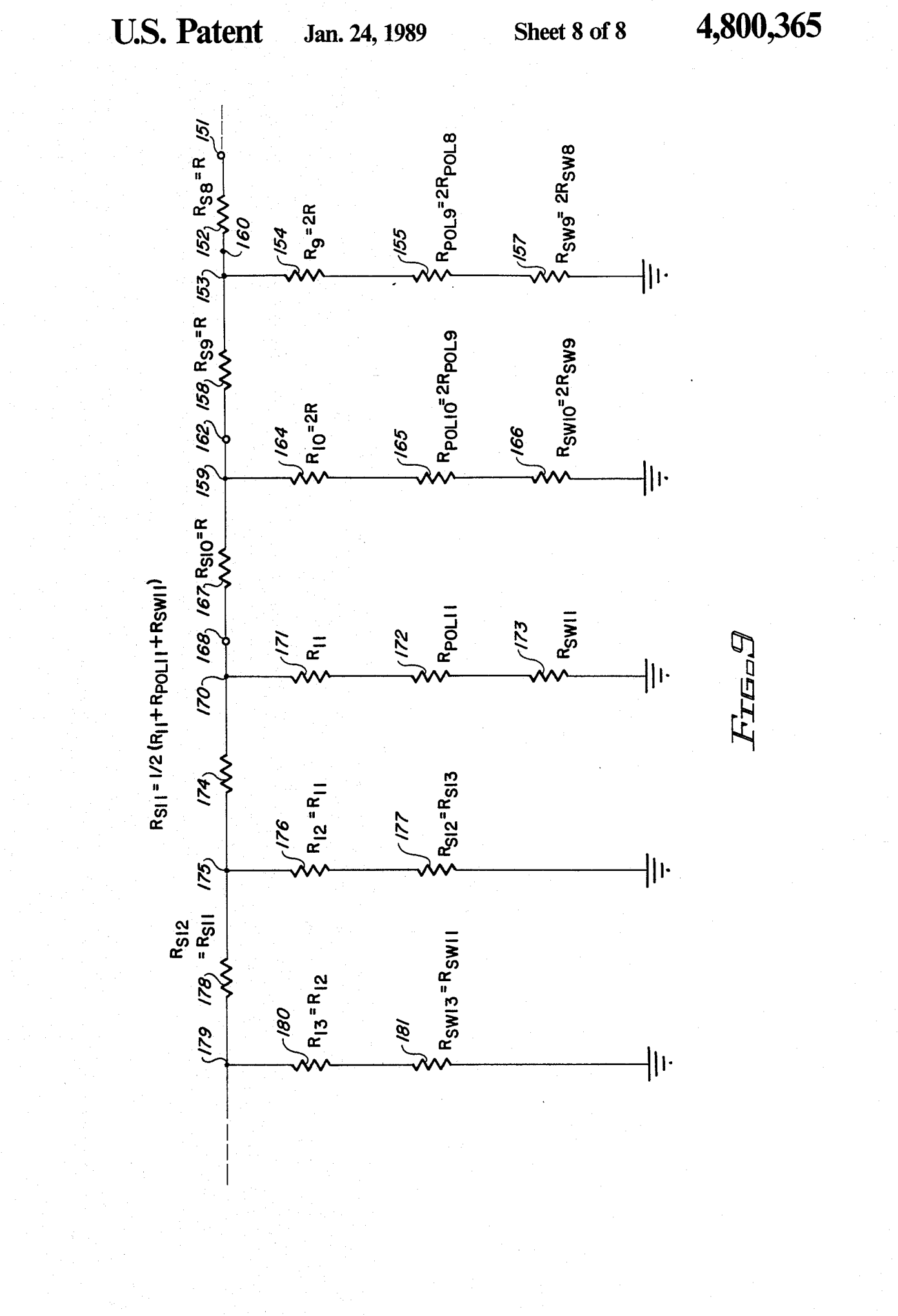

FIG. 9 shows a more detailed description of part of the modified R-2R voltage dividing ladder network circuit described u above. In FIG. 9, the sections of the ladder network to the right of node 151 corresponding to bits 1-8 have been deleted, and the sections of the ladder network to the left of node 179 corresponding to bits 14-16 also have been deleted, as they are not essential to understanding the modified R-2R ladder structure of the present invention. Resistor 152, also designated by $R_{S8}$, has a selected value R, which for purposes of this example can be 10 kilohms. Resistor 152 is connected to node 153. The "parallel leg" for bit 9 includes resistors 154, 155, and 157, having values of $R_9$, $R_{POLY9}$, and $R_{SW9}$. $R_{SW9}$ is the bit switch MOSFET resistance for bit 9 of the ladder network. $R_9$ is equal to value 2R, as in a conventional R-2R ladder. $R_{POLY9}$ is the resistance of a polycrystalline silicon crossunder.

Note that the sections of the ladder corresponding to bits 1 through 10 utilize binarily weighted bit switch resistances and binarily weighted poly resistances. Poly resistances are resistances associated with polycrystalline silicon crossunders that may be required in the layout of the ladder topography. In accordance with the invention, the sections of the ladder corresponding to bits 11 through 16 do not utilize binarily weighted of poly resistances or binarily weighted bit switch resistances. This technique avoids the problem of excessive chip area being used because of doubling the size of the poly crossunder resistances and doubling the size of the bit switch MOSFETs for each successive one of bits 11–16. The technique of the invention also avoids the problem that the width-to-length ratio is small for bit switch MOSFETs for bits 13–16 that operate in their saturated regions, introducing major inaccuracies in the analog output voltage produced by the ladder.

In accordance with the present invention, the basic ladder structure (with binarily weighted bit switch resistances and binarily weighted poly resistances) is modified for bits 11–16 using bit switch resistances and poly resistances which are not binarily weighted. This can be done with minimum error if the equivalent resistance of the section containing non-binarily weighted resistances is equal to the equivalent resistance of the section containing binarily weighted resistances. The "equivalent resistance" refers here to the resistance to ground of the ladder network to the left of a point such as 162.

The criterion for minimum error can be met if the following equations are satisfied:

$$\tfrac{1}{2}(R_{11}+R_{POL11}+R_{SW11})+R_{S10}=R_{10}+R_{POL10}+R_{SW10}, \quad (1)$$

$$R_{POL11}/2+R_{SW11}/2=R_{POL10}+R_{SW10}. \quad (2)$$

where the first term to the left in equation (1) is the equivalent resistance to the left of point 168, the second term $R_{S10}$ is the series resistance for bit 10, and the term on the right-hand side of equation (1) is the parallel resistance for bit 10.

In a normal implementation of this type, $R_{11}$ and $R_{10}$ are equal to 2R, and $R_{S10}$ is equal to R. Equation (2) is satisfied if $R_{POL11}=2R_{POL10}$, and $R_{SW11}=2R_{SW10}$.

In this design, however, a smaller value of $RP_{OL11}$ was chosen for layout reasons. Equation (1) was then satisfied at one temperature by adding the resistance error in $R_{POL11}$ to $R_{11}$. The numerical results are as follows:

$R_{10}=10$ kilohms; $R_{POL10}=1.17$ kilohms; $R_{SW10}=1.54$ kilohms; $R_{S10}=10$ kilohms; $R_{11}$ is unknown; $R_{POL11}=0.32$ kilohms; $R_{SW11}=3.07$ kilohms.

For these values, equation (1) can be written as:

$\tfrac{1}{2}(R_{11}=0.32$ kilohms$+3.07$ kilohms$)+(10$ kilohms$=20$ kilohms$+1.27$ kilohms$+1.54$ kilohms$)$.

To satisfy this equation,
$R_{11}=2(10$ kilohms$+1.27$ kilohms$+1.5$ kilohms$-0.32/2$ kilohms$=3.07/2$ kilohms$)=22.2$ kilohms.

Equation (3) determines $R_{S11}$, since bit switch and poly resistances are not binarily weighted for bits 11–16. Thus, $$R_{S11}=\tfrac{1}{2}(R_{11}+R_{POL11}+R_{SW11}). \quad (3)$$

$\tfrac{1}{2}(22.2$ kilohms$+0.32$ kilohms$+3.07$ kilohms$)=12.8$ kilohms.

The above-described structure is a considerable departure from any prior known voltage divider resistive ladder network, and provides the above-indicated advantages of avoiding the need to continue binarily scaling bit switch resistances and poly resistances and the excessive amount of chip area that would be required therefor and also avoids errors caused by operation of the bit switch MOSFETs in their saturated regions for the higher order bits.

Figure 3:
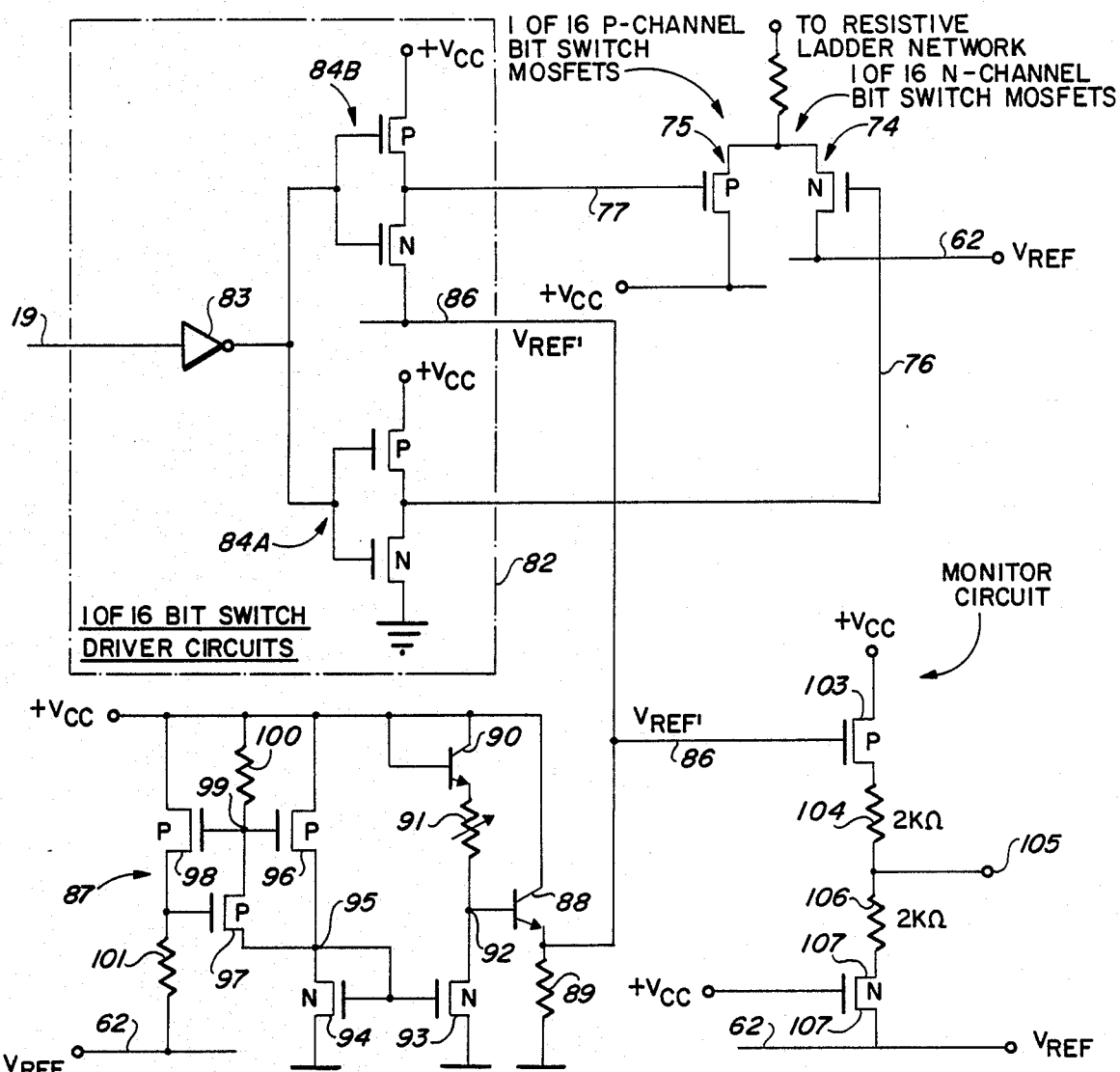
FIG. 3 is a schematic diagram of a portion of the circuitry contained in the diagram of FIG. 1 for matching the channel resistances of P-channel bit switch MOSFETs and N-channel bit switch MOSFETs.

Referring now to FIG. 3, each of the latch output conductors 19 (FIG. 1) is connected to the input of a CMOS inverter 83 contained in a bit switch driver circuit 82. CMOS inverter 83 is connected between ground and $V_{CC}$, and has its output connected to the inputs of a CMOS inverter 84A and a CMOS inverter 84B. Inverter 84A is referred to as the N-channel bit switch driver, and consists of a CMOS inverter connected between $V_{CC}$ and ground. The P-channel bit switch driver 84B is connected between $V_{CC}$ and a reference voltage $V_{REF'}$, and has its output connected to conductor 77. Circuitry 23 of FIG. 1 includes a separate bit switch driver circuit 82 for each of the 16 bits of the digital-to-analog converter 1. A high level on conductor 19 produces a low level at the inputs of inverters 84A and 84B, and high levels at their outputs, turning the N-channel MOSFET 74 on and turning the P-channel MOSFET 75 off. A low level of conductor 19 turns P-channel MOSFET 75 on and N-channel MOSFET 74 off.

The above described resistive ladder performs a voltage division function, rather than the more common current splitting function performed by R-2R resistive ladders commonly used in bipolar integrated circuit DACs. For each bit switch, one of the two MOSFETs 74 and 75 is turned on and the other is turned off. Consequently, the on channel resistances of P-channel bit switch MOSFET 75 and N-channel bit switch MOSFET 74 must be precisely equal. Each bit switch selectively connects its ladder resistor to either $V_{CC}$ or $V_{REF}$. It can be shown that to obtain binary scaling, each binary bit switch should have half the resistance of the previous one and that the on channel resistances of the P-channel and N-channel bit switch MOSFETs in the same bit switch must be very precisely matched.

The $V_{REF'}$ reference voltage is produced by circuit 87 of FIG. 3 in response to another reference voltage $V_{REF}$ on conductor 62. $V_{REF}$ conductor 62 is connected by resistor 101 to the gate electrode of P-channel MOSFET 97 and the drain electrode of P-channel MOSFET 98, the source of which is connected to $V_{CC}$. The drain of MOSFET 97 is connected to the drain of P-channel MOSFET 96 and to the gate and drain of N-channel MOSFET 94, the source of which is connected to ground. The source of MOSFET 97, the gate of MOSFET 98, and the gate of MOSFET 96 are connected by resistor 100 to $V_{CC}$. The source of MOSFET 96 is connected to $V_{CC}$. Conductor 95 is converted to the drain of MOSFET 96, the drain of MOSFET 97 and the gate and drain of N-channel MOSFET 94, the source of which is connected to ground. Conductor 95 also is connected to the gate of N-channel MOSFET 93, the source of which is connected to ground and the drain of which is connected by conductor 92 to the base of NPN transistor 88 and to one terminal of trimmable nichrome resistor 91, the other terminal of which is connected to the emitter of NPN transistor 90.

The base and collector of transistor 90 are connected to $V_{CC}$. The collector of transistor 88 is connected to $V_{CC}$ and its emitter is connected to conductor 86 and to one terminal of resistor 89, the other terminal of which is connected to ground. The voltage $V_{REF'}$ is produced on conductor 86.

A "monitor" circuit, including P-channel MOSFET 103 and N-channel MOSFET 107 and two equal (2 kilohm) nichrome resistors 104 and 106, is connected between $V_{CC}$ and $V_{REF}$ conductor 62. The gate of P-channel MOSFET 103 is connected to $V_{REF}$ conductor 86, and its source is connected to $V_{CC}$. Its drain is connected to one terminal of resistor 104, the other terminal of which is connected by a bonding pad test conductor 105 to one terminal of resistor 106, the other terminal of which is connected to the drain of N-channel MOSFET 107. The gate of MOSFET 107 is connected to $V_{CC}$ and its source is connected to $V_{REF}$ conductor 62.

The ratio of the geometry of P-channel MOSFET 103 to that of N-channel MOSFET 107 is equal to the ratio of the geometry of P-channel bit switch MOSFET 75 to that of N-channel bit switch MOSFET 74, where the geometries referred to are the channel length-to-width ratios. The resistances of resistors 104 and 106 are equal, and have sufficiently high values, for example, 2 kilohm, to ensure that MOSFETs 103 and 106 are in their linear or unsaturated regions. The voltage on probe pad conductor 105 is measured to control laser trimming of nichrome resistor 91 so that the voltage $V_{REF}$ has a value that causes the channel resistance of MOSFETs 103 and 107 to be identical. When the measured voltage on conductor 105 is equal to $(V_{CC}-V_{REF})/2$, then it can be seen that the N-channel MOSFET 107 has the same terminal voltages and hence the same channel resistance as N-channel bit switch MOSFET 74 when it is on, and that P-channel MOSFET 103 has the same terminal voltages and hence the same channel resistance as P-channel bit switch MOSFET 75 when it is on. Therefore, trimming of resistor 91 to adjust the channel resistance of MOSFET 103 to equal that of MOSFET 107 automatically causes the on resistance of P-channel monitor MOSFET 103 to equal the on resistance of N-channel monitor MOSFET 107. This causes the N-channel bit switch driver 84A and the P-channel bit switch driver 84B to produce voltages that cause the on channel resistances of the P-channel MOSFET 75 and the N-channel MOSFET 74 of each bit switch to be equal. Since process parameter variations do not affect all of the P-channel MOSFETS and N-channel MOSFETS similarly, the above described trimming technique effectively compensates for bit switch resistance mismatches caused by differences the manner in which various process parameter variations offset P-channel and N channel MOSFETs.

The portion of the circuitry including MOSFETs 97, 98, 96, 94, and 93 and resistors 101 and 100 in FIG. 3 provides a current mirror with a stable temperature coefficient to supply current to laser trimmable resistor 91. It should be noted that the $V_{REF0}$ reference voltage produced by the circuit of FIG. 4 (subsequently described) and the $V_{REF}$ reference voltage produced by the reference amplifier of FIG. 5 (subsequently described) track closely with $V_{CC}$, so that variations in $V_{CC}$ also appear in $V_{REF}$. The circuit of FIG. 3 therefore causes the established precise matching of the on channel resistances of the P-channel bit switch MOSFET 75 and the N channel bit switch MOSFET 74 to be maintained as $V_{CC}$ varies. (A typical specification for $V_{CC}$ would be from 4.75 volts to 6.5 volts.)

Next, referring to FIG. 4, the reference circuit 54 of FIG. 1 will be described. The internal reference voltage $V_{REF0}$, which is constant with respect to temperature, is produced on conductor 55. Conductor 55 is connected to one terminal of each of resistors 113 and 114, to the bases of NPN transistors 117 and 118, and to the gate electrode of P-channel MOSFET 121. R2 resistor 113 is composed of nichrome, the resistance of which is essentially temperature-invariant. Its other terminal is connected by conductor 112 to one terminal of R1 resistor 111, which is formed in a lightly doped P-type well region of the same resistivity as that of the P-type well regions in which the N-channel MOSFETs of digital-to-analog converter 1 are formed. The other terminal of R1 resistor 111 is connected to $V_{CC}$. The resistance of R1 resistor 111, which can have a value of 35.3 kilohms, can have a temperature variation of about +6,000 parts per million per degree Centigrade.

Resistor 114 is formed of nichrome, and its lower terminal is connected to the emitter of transistor 117 and to one terminal of nichrome resistor 115. The lower terminal of resistor 115 is connected to the emitter of transistor 118, the base of NPN transistor 124, and to one terminal of nichrome resistor 116, the other terminal of which is connected to the emitter of transistor 124 and to the drain of N-channel MOSFET 125, the source of which is connected to ground.

The collectors of transistors 117, 118, and 124 are connected to $V_{CC}$. The gate of MOSFET 125 is connected to the gate and drain of N channel MOSFET 126, the source of which is connected to ground. The drain of MOSFET 126 is connected by a resistor 126A formed in a P well type region to $V_{CC}$. The source of P-channel MOSFET 121 is connected by trimmable nichrome resistor 122 to $V_{CC}$. The drain of MOSFET 121 is connected by conductor 123 to a bias generator circuit (not shown), which is a current mirror circuit including a plurality of N-channel MOSFETs, wherein the current through conductor 123 controls the current through the various N-channel MOSFET current mirror transistors of the bias generation circuit.

Figure 4:
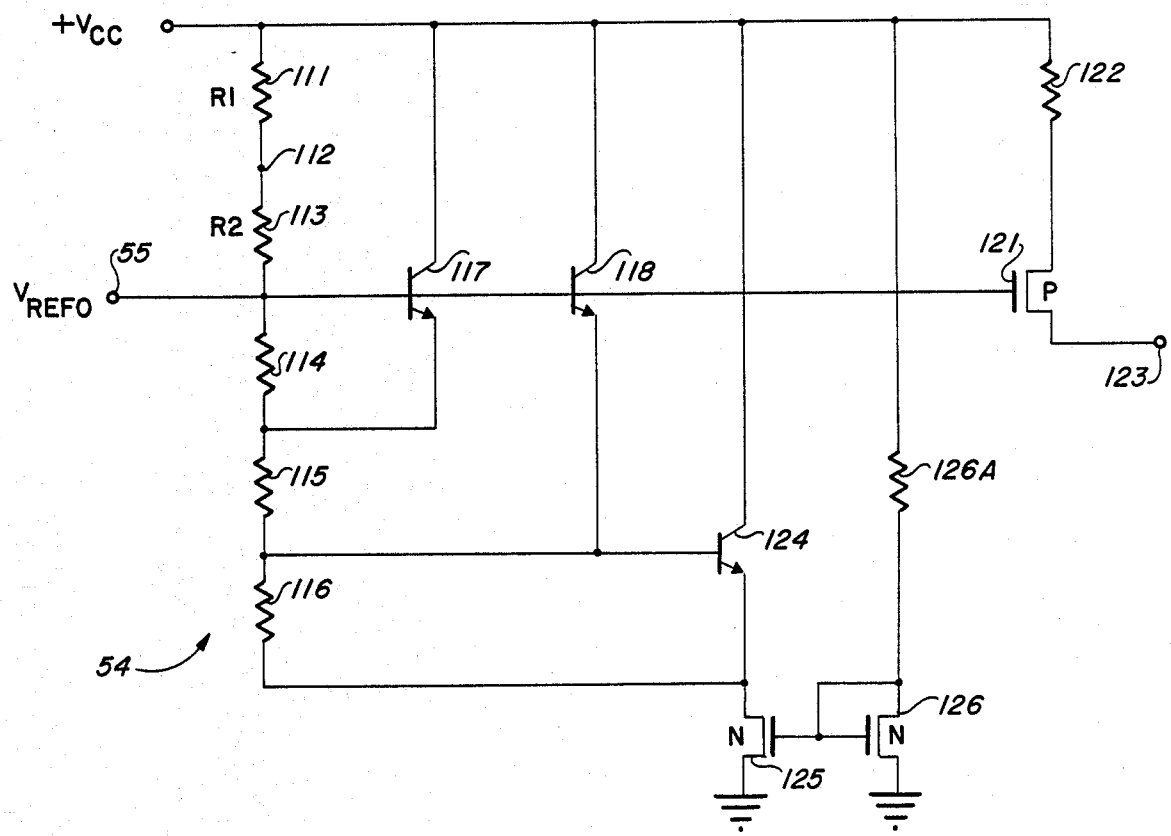
FIG. 4 is a schematic circuit diagram of a temperature invariant reference voltage circuit utilized in the DAC of FIG. 1.

In operation, the reference circuit of FIG. 4 produces a nearly temperature-invariant reference voltage $V_{REF0}$ on conductor 55 that varies with certain processing parameters. In accordance with the invention, the voltage across resistor 115, the resistance of which can be 1 kilohm, is maintained constant with respect to temperature since it is equal to the difference in the voltages between the emitters of transistors 117 and 118 which voltage difference is determined by the difference in the current densities therein. This causes the current through nichrome resistor 115 also t be temperature-invariant. Resistor 15 therefore appears to resistor 114 and transistor 117 as a constant current source, although it is not essential that this current source be constant.

The voltage across nichrome resistor 114 has the same temperature variation as the base-to-emitter voltage of transistor 117. The resistance of resistor 114 is temperature-invariant due to the fact it is composed of nichrome. The current through resistor 114 therefore has the same variation with temperature as $V_{BE}$ of transistor 117, that is, approximately −3,300 parts per million per degree Centigrade. Assuming the base current of transistors 117 and 118 and the gate current of MOSFET 121 to be negligible, it can be shown that the condition for $V_{REF0}$ being temperature-invariant is given by the equation $$(+6000)(I)(R1)+(-3,300)(I)(R1+R2)=0.$$

This leads to the equation
$R1/(R1+R2)=3,300/6000.$

The operation of the circuit of FIG. 4 can be intuitively understood by recognizing that the reference voltage $V_{REF0}$ is equal to $V_{CC}$ minus the sum of the voltage drops across resistors R1 and R2. Since R2 is temperature-invariant, the voltage drop across R2 will have a negative variation with respect to temperature. The variation in the voltage drop across P-well semiconductor resistor R1 will be positive, since the positive temperature coefficient of R1 is greater than the negative temperature coefficient of the current flowing through it. The values of R1 and R2 therefore can be chosen so that the positive temperature variation of the voltage drop across R1 precisely cancels the negative temperature variation in the voltage drop across resistor R2. Although a rigorous mathematical analysis shows that there are second order effects that cause an increase in VREF0 as the temperature increases, the circuit of FIG. 4 has been shown to be adequate for the DAC described herein.

Thus, it is seen that the circuit of FIG. 4 provides a temperature-invariant reference voltage without using a complex band gap circuit, which would not be readily implementable by a conventional integrated circuit CMOS process in which only resistors, N-channel MOSFETs, P-channel MOSFETs, and NPN transistors having their collectors formed in the integrated circuit substrate can be conveniently implemented. (Lateral NPN transistors were thought to be unsatisfactory for making conventional band gap circuits that otherwise might have been used.)

For the above indicated resistance values in Table 1, the value $V_{REF0}$ is approximately 2.5 volts below $V_{CC}$.

The following table indicates the values of the various components in temperature-invariant reference circuit 54.

TABLE 1

| RESISTOR | KILOHMS |
|---|---|
| 111 | 35.3 |
| 113 | 9.04 |
| 114 | 6.33 |
| 115 | 1.5 |
| 116 | 4 |
| 122 | 18.46 |
| 126A | 36 |

Figure 5:
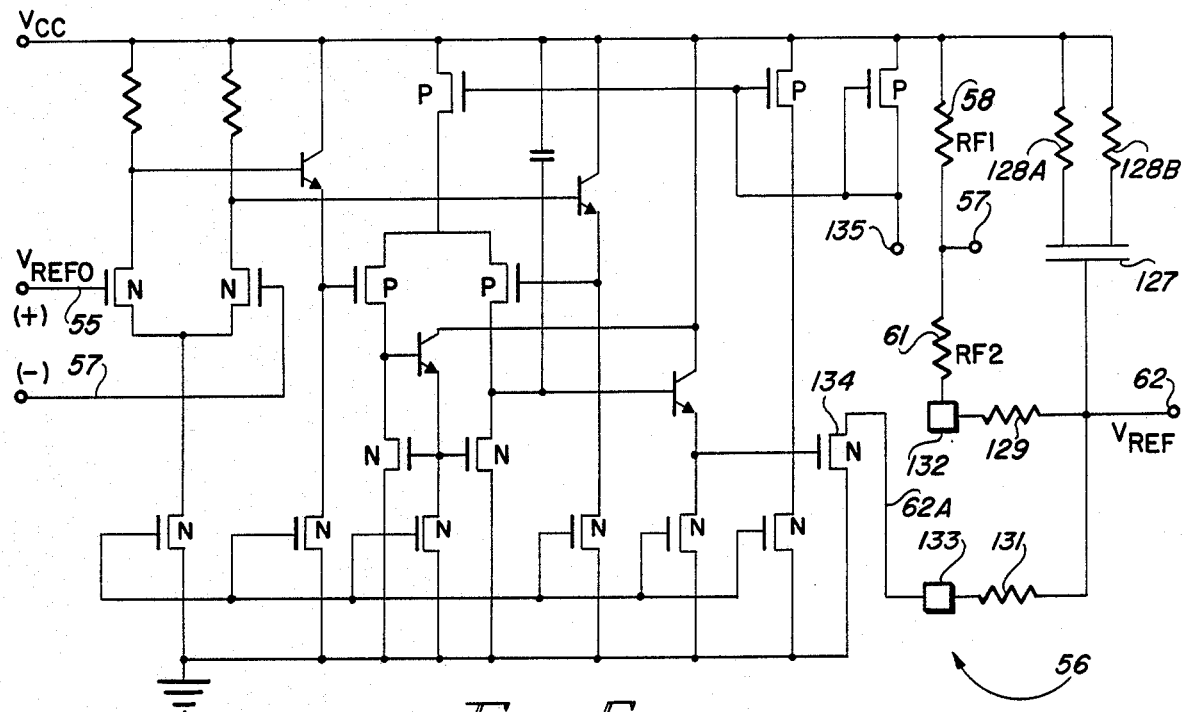
FIG. 5 is a circuit diagram of a reference buffer amplifier utilized in the DAC of FIG. 1.

Next, the reference amplifier circuit 56 in FIG. 1 is described in detail with reference to FIG. 5. Most of the details of the amplifier portion of this circuit are not pertinent to the present invention, and are shown for completeness of disclosure only. Conductors 55 and 57 are the positive and negative inputs of its differential input stage. The drain electrode of output N channel MOSFET 134 is connected by conductor 62A to a bonding pad 133, and its source is connected to ground. Conductor 135 is connected to the drain of a P-channel current mirror control MOSFET and to the above-mentioned bias generator circuit to establish appropriately scaled constant currents in the current mirror circuits contained in FIG. 3C.

An external feedback resistor 58 having a resistance $R_{F1}$ of 2.6 kilohms is connected between $V_{CC}$ and conductor 57. Conductor 57 is fed back to the negative input of reference amplifier 56 and also is connected to resistor 61, which has a resistance $R_{F2}$ of 1 kilohm. The other terminal of $R_{F2}$ resistor 61 is connected to a bonding pad 132. Reference numeral 129 designates the wire bonding resistance of approximately 0.1 ohm between bonding pad 132 and conductor 62 of an external capacitor 127 on which the reference voltage $V_{REF}$ is produced. The other terminal of external capacitor 127 is connected by two roughly 0.1 ohm wire bonding resistances 128A and 128B to $V_{CC}$. This "double bond" of the upper terminal of capacitor 127 produces an equivalent bonding resistance of 0.05 ohms, rather than the 0.1 ohm resistance of a "single bond". A separate wire bond between bonding pad 133 and conductor 62 has a second 0.1 ohm wire bonding resistance 131. Wire bonding pads 132 and 133 are connected to separate leads of a package which then are connected together on a printed circuit board. The lower terminal of capacitor 127 is then connected to that point.

At this point it should be noted that reference amplifier 56 needs to have high gain and low output impedance over a wide frequency range to be able to absorb large current spikes that may occur on $V_{REF}$ conductor 62. The large capacitance 127 performs this function, but may also produce a pole that results in amplifier instability, if the amplifier is internally compensated. In accordance with the present invention, the amplifier is left uncompensated internally, and capacitor 127 is used both to absorb spikes and to perform open loop compensation of the amplifier. The dominant pole of the amplifier then is formed by the open loop output impedance of the amplifier and the large external capacitor 127. In order to precisely control the location of the dominant pole, resistors RF1 and RF2 are chosen to provide the desired output impedance.

The external capacitor 127 value is so large that the 0.1 ohm wire bond resistance in series with it creates a zero at frequencies which are sufficiently low to cause amplifier instability. In accordance with the present invention, the above connection of the wire bonding resistances increase the frequencies at which a zero can occur, avoiding such instabilities. It has been found that if the above bonding technique is not used, i.e., if conductor 62 is connected directly to the drain electrode of N-channel MOSFET 134, there is a substantial deterioration in the high frequency response of the circuit. This was found to be due to the 0.1 ohm wire bonding resistance to the external capacitor 127.

The effect of providing separate wire bonds from conductor 62 to bonding pads 132 and 133 is to prevent the 0.1 ohm wire bonding resistances from appearing between conductor 62 and external 10 microfarad capacitor 127, and thereby possibly producing the zero in the low frequency response of the reference amplifier circuit 56. More specifically, this occurs because the 0.1 ohm resistance of wire bonding resistance 131 appears in series with the much larger series resistance of N-channel MOSFET 134, which is operating in its saturated mode and which comes very close to being an ideal current source. Similarly, the 0.1 ohm bonding resistance 129 is "lumped" with the 1 kilohm feedback resistor RF2 of resistor 61, and has very little effect on the gain or frequency response of the reference amplifier 56. Effectively, the circuit node that determines the zero in the frequency response of amplifier 56 has been transferred from conductor 62A inside the package containing amplifier 56 to the "outside world", i.e., external node 62. Approximately half of the wire bonding resistance thereby has been eliminated, resulting in the zero occurring at a point an octave higher in frequency. By providing the double bond of the upper terminal of capacitor 127 to the $V_{CC}$ conductor, decreasing its resistance from 0.1 ohms to 0.05 ohms, the zero is moved another octave higher in frequency.

What thus has been accomplished is the connection of a very large capacitor to the output of the operational amplifier without ruining its frequency response. This connection of a Class A output stage, wherein the output resistance s also the feedback resistance, enables a very large output capacitance to be driven. The technique of compensating the dominant pole of the amplifier by connections to the output stage of the amplifier is thought to be novel; a more conventional approach would be to provide dominant pole compensation internally, with a Miller capacitance connected between the collector and base of the NPN transistor whose emitter is connected to the gate electrode of output transistor 134.

Figure 3A:
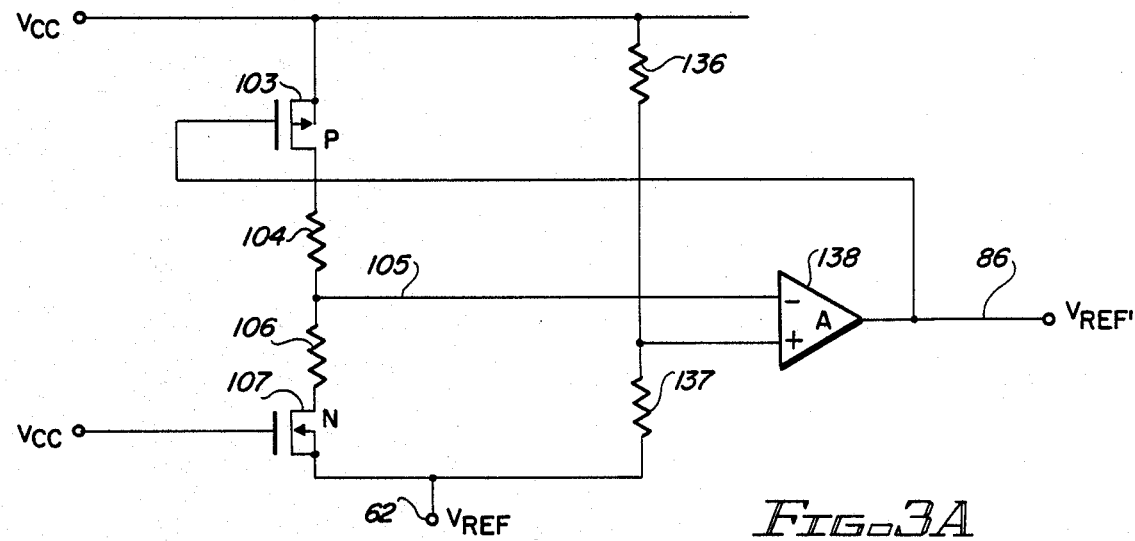
FIG. 3A is a schematic diagram of an alternate circuit for generating the $V_{REF}$ in the circuit of FIG. 3.

Referring now to FIG. 3A, an alternate circuit for generating $V_{REF}$ without utilizing the above monitor circuit output measurement and laser trimming process is shown. P-channel MOSFET 103 has its source connected to $V_{CC}$ and its drain connected by resistor 104 to conductor 105. Conductor 105 is connected to the negative input of a high gain operational amplifier 138. Conductor 105 also is connected by resistor 106 to the drain of N-channel MOSFET 107, the source of which is connected to $V_{REF}$ conductor 62. The gate of MOSFET 107 is connected to $V_{CC}$. Resistors 136 and 137 are connected in series with MOSFETs 103 and 107 between $V_{CC}$ and $V_{REF}$, and the junction 105 between those resistors is connected to the positive input of amplifier 138. The output of amplifier 138 is connected to conductor 86, which is connected to the gate electrode of P-channel MOSFET 103 and conducts the reference voltage $V_{REF}$. This circuit functions effectively if resistors 104 and 106 are equal and resistors 136 and 137 are equal, if P-channel MOSFET 103 and N-channel MOSFET 107 have geometry ratios equal to the ratios between the P-channel MOSFETs 75 and N-channel MOSFETs 74 of each bit switch pair of the voltage dividing ladder network of FIG. 2, and if the gain of amplifier 138 is sufficiently high to accurately sense the difference in voltage between conductor 105 and the voltage of the junction between resistors 136 and 137. If these conditions are met, the circuit of FIG. 3A provides an accurate correction voltage on the gate of P-channel MOSFET 103, causing its on resistance to be identical to the on resistance of N-channel MOSFET 107.

In operation the circuit shown in FIG. 3A is effectively a bridge circuit the output nodes of which are sensed by the op amp 138, the feedback from which adjusts the resistance of MOSFET 103 so that the sum of the resistances of it and resistor 103 equals the sum of resistor 106 and the resistance of MOSFET 107.

It also should be noted that the values of the resistors in FIG. 3A and the on channel resistance values of MOSFETs 103 and 107 must be such that MOSFETs 107 and 103 are in their "linear" regions, rather than their "saturated" regions. The on resistances of MOSFETs 103 and 107 must be small compared to the resistances of the resistors 104 and 106.

For very high fidelity audio systems in which the DAC of FIG. 1 is to be used, some users may prefer to provide "simultaneously converted" analog output voltages on the right and left speaker channels. Doing this requires use of two separate DACs which function differently for right and left channel operation. In accordance with the invention, selectable modes are provided to allow the unit to serve as a left channel DAC, a right channel DAC or as a multiplexed two channel stereo DAC.

The 16-bit digital-to-analog converter 1 of the present invention is operable in a "single DAC mode" in which alternating 16-bit serial inputs are alternately loaded into the inputs of the latches 9 and to the inputs of the 16 bit switches to produce alternate corresponding analog voltage changes on the left and right channel outputs. The digital-to-analog converter 1 also is operable as either a "right channel DAC" or a "left channel DAC" in a system in which simultaneous digital to analog conversions are made of the right channel data and left channel data.

FIG. 7 shows the logic diagram of mode decode circuit 15. The manner in which the mode decode circuitry 15 operates is best understood with reference to the timing diagrams of FIGS. 8A and 8B.

Table 2 shows the modes of operation of mode decode circuit 15 as a function of the mode control inputs MODE1 and MODE2.

TABLE 2

| MODE1 | MODE2 | FUNCTION |
|-------|-------|----------|
| 0 | 0 | Single DAC with stereo output |
| 0 | 1 | Not used |
| 1 | 0 | Left channel DAC |
| 1 | 1 | Right channel DAC |

In the "single DAC" mode, DAC 1 alternately converts serial digital right channel 16 bit data words and left channel 16 bit data words and presents the resulting analog signals at right channel and left channel outputs 42 and 53 of integrate and hold circuits 38 and 51, respectively. In the "left channel" mode, the DAC of the present invention is used only to convert serial left channel 16 bit data words into analog signals, which then are produced at output 42 of integrate and hold amplifier 38. In the "right channel" mode, the DAC of the present invention is used only to convert serial right channel 16 bit data words into analog signals which also are produced at output 42 of integrate and hold amplifier 38. In both the left channel and right channel modes, the left channel integrate and hold amplifier 51 is inhibited.

The L/RCK signal is a timing signal that indicates whether the present data on terminal 2 of the DAC belongs to the right channel or the left channel. Signal WDCK is a word clock that provides a negative going edge when the last bit of the present data word has been placed on data terminal 2. The CK signal is the basic clock signal which is used to synchronize the L/RCK, WDCK, and DATA inputs. RI and RI* are right channel integrate signals that control the operation of the integrate and hold amplifiers 38 and 51 in accordance with the selected mode. The signals LI and LI* are left channel integrate signals that similarly control the operation of the left integrate and hold amplifier 51 in accordance with the selected mode of operation.

Figure 8A:
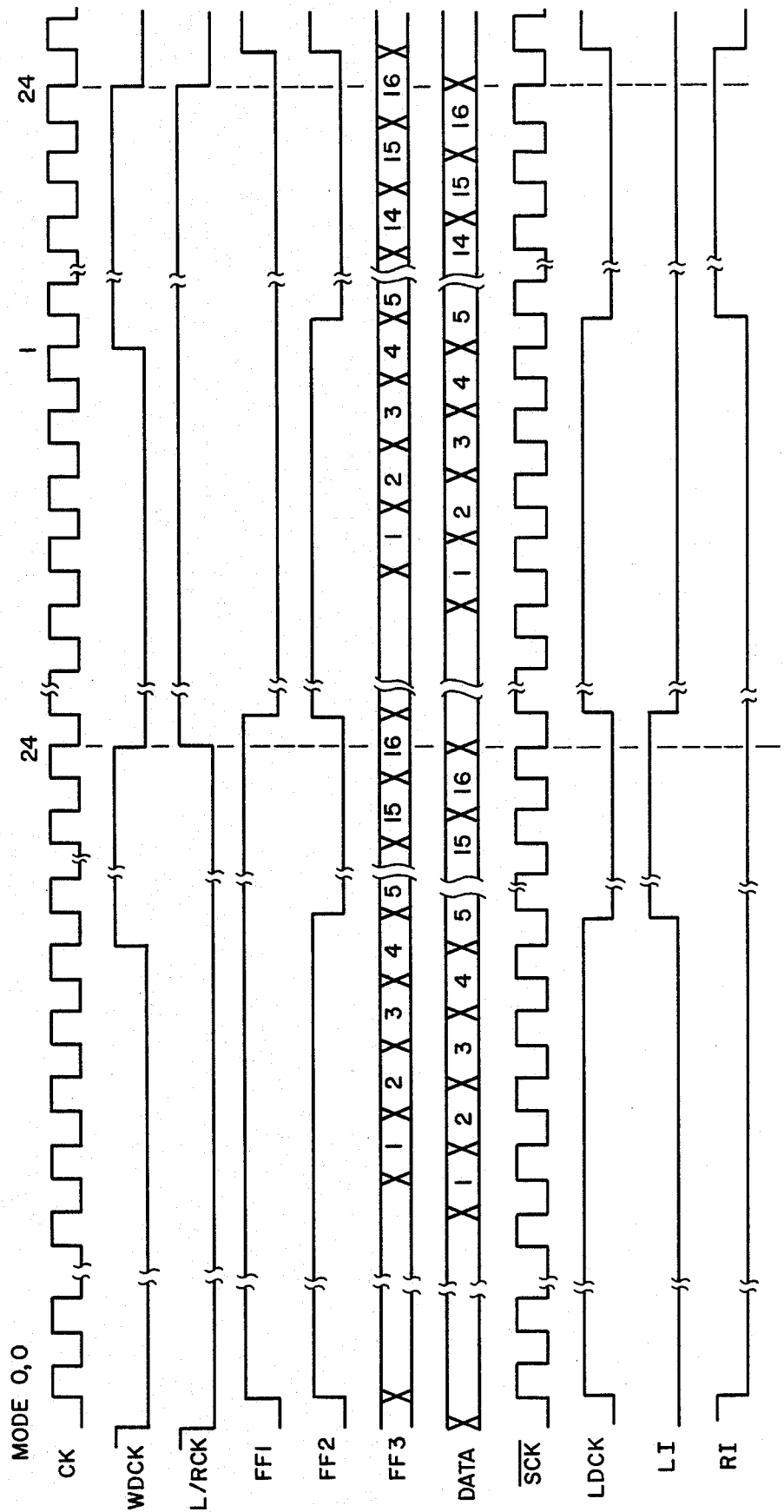
FIGS. 8A and 8B include timing diagrams of signals associated with the mode logic circuit of FIG. 7.

FIG. 8A shows the CK, WDCK, L/RCK and DATA input signals when MODE1 AND MODE2 signals both are "zeros". The signals FF1, FF2, and FF3 produced at the outputs of flip-flops FF1, FF2, and FF3, respectively in FIG. 7, are simply synchronized versions of L/RCK, WDCK, and DATA, respectively. The low level of L/RCK indicates that the present data is for the right channel, and the high value of L/RCK indicates that the present data is for the left channel.

The INH signal inhibits integrate and hold amplifier 51 during the right channel mode and the left channel mode, so when INH is equal to "0", left channel integrate and hold amplifier 51 is not inhibited. When RI is a "1", conductor 39 is coupled by transmission gate 36 and resistor 24 to the negative input of right channel integrate and hold amplifier 38. When LI is high, conductor 39 is coupled by transmission gate 47 and resistor 25 to the negative input of left channel integrate and hold amplifier 51. The right channel data is alternately converted and held in analog form at the right channel output 42. The left channel word data likewise is alternately converted to analog form and held on the left channel output 53.

Figure 8B:
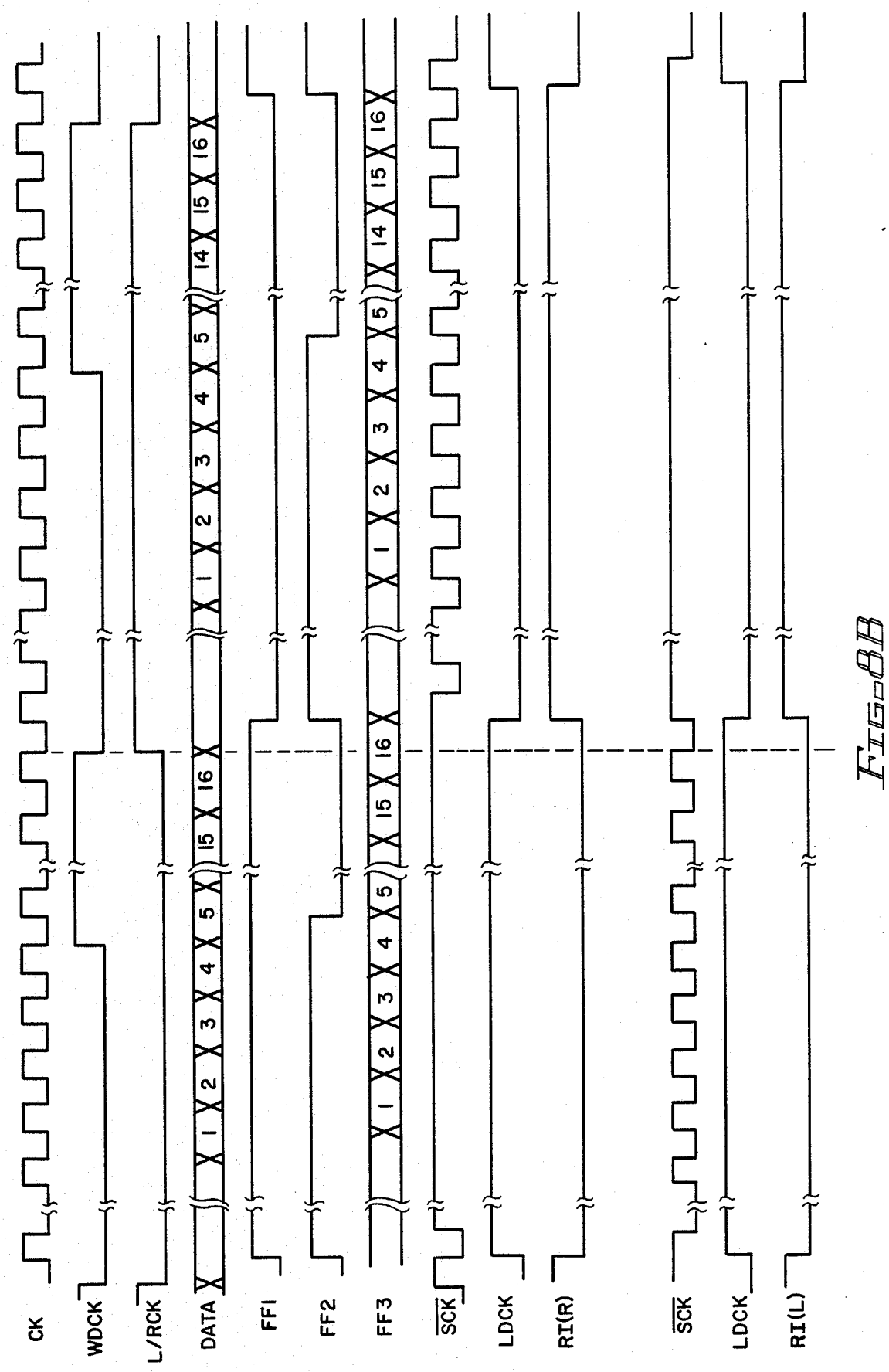

In FIG. 8B, the waveforms CK, WDCK, L/RCK, DATA, FF1, FF2, and FF3 are identical for both mode 1,0 and mode 1,1. The upper group of waveforms SCK*, LDCK, and RI correspond to the condition when MODE1 equals "1" and MODE2 equals "0". The bottom group of the SCK*, LDCK, and RI waveforms correspond to the condition when MODE1 equals "1" an MODE2 equals "1". For both of these modes, the DAC is performing only a single function, as either a right channel DAC or as a left channel DAC. It can be seen that the RI signal changes at a lower frequency than for the timing diagram of FIG. 8A. In the upper SCK* waveform in FIG. 8B, the long duration high level corresponds to a delay in gating the right channel data word to the negative input of integrate and hold amplifier 38. Thus, the RI(R) right channel integrate signal goes positive simultaneously with the RI(L) left channel integrate signal for both mode 1,0 and mode 1,1, so that conversion of right channel data and left channel data occurs simultaneously. In both mode 1,0 and mode 1,1, the signal INH is a "1", so that transmission gate 66 is turned on, and the integrate and hold amplifier 51 is inhibited, as only the right channel integrate and hold amplifier 38 is being used.

Figure 6:
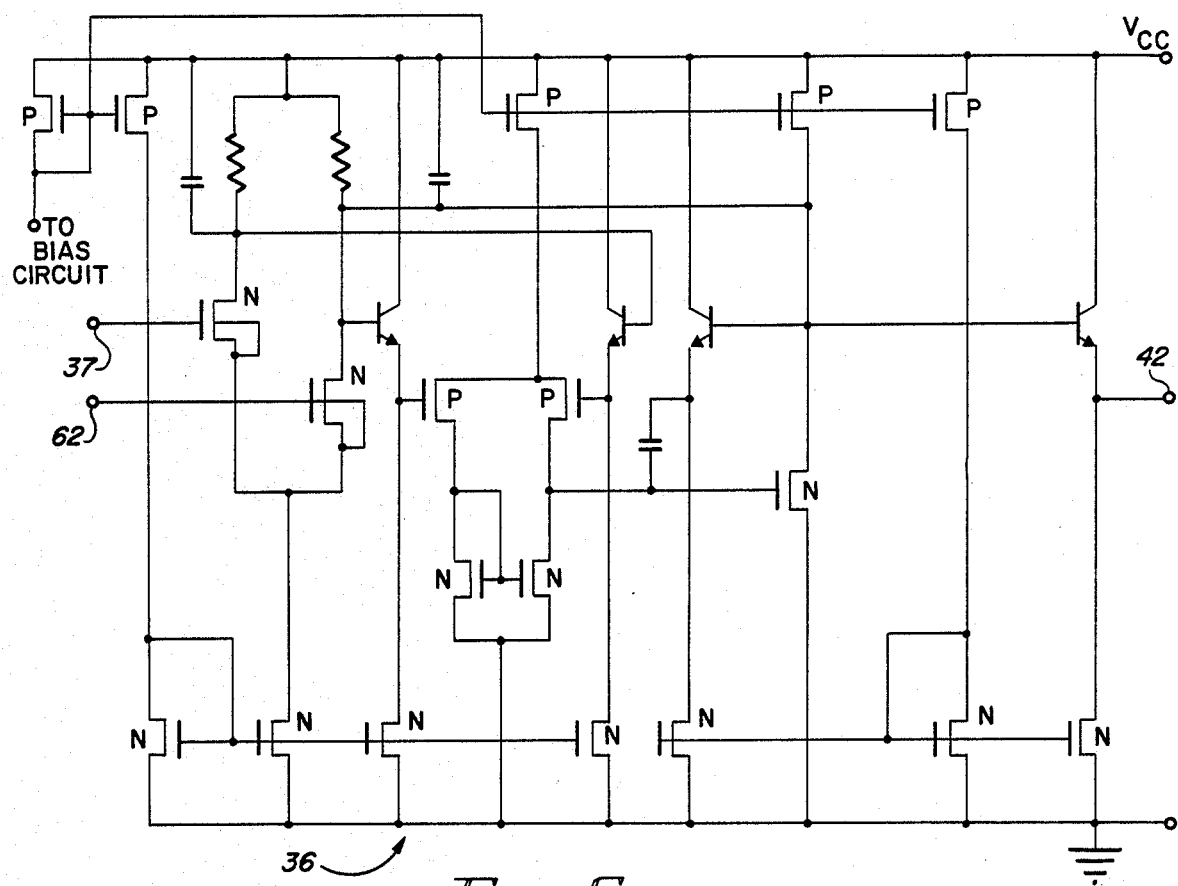
FIG. 6 is a schematic circuit diagram of the integrate and hold amplifiers used in the DAC of FIG. 1.

Next, the function of buffer amplifier 43 in FIG. 1 will be explained. As previously indicated, CMOS transmission gates 36 and 47 are on during the right integrate (RI) and left integrate (LI) time durations, respectively. However, when CMOS transmission gates 36 and 47 are off, the voltage on conductors 26 and 27 can change during the "hold" portion of the cycle, when integrate and hold amplifiers 38 and 51 are holding their respective analog output voltages on capacitors 41 and 52, respectively. This occur because the DAC ladder network 23 is converting a different digital word from the opposite channel into a different analog voltage on conductor 39. Then, when the next integrate time occurs, a large difference occurs between the positive and negative inputs of the integrate and hold amplifiers 38 or 51, causing them to saturate and thereby causing a long recovery time. Buffer amplifier 43, in conjunction with CMOS transmission gates 32 and 44, prevents this from happening by forcing conductor 26 to have the same voltage as conductor 37 when CMOS transmission gate 36 is off and CMOS transmission gate 32 is on. This occurs because the positive and negative inputs of integrate and hold amplifier 38 are at the same potential, namely the potential on conductor 64. Then, when CMOS transmission gate 36 is turned back on during the next integrate period, conductor 26 and conductor 37 will be at essentially the same potential as conductor 64, and no saturation of integrate and hold amplifier 38 will occur. Operation is similar for CMOS transmission gates 44 and 47, conductor 27, and integrate and hold amplifier 51. A circuit for implementing buffer amplifier 43 is shown in FIG. 6.

While the invention has been described with reference to a particular embodiment thereof, those skilled in the art will be able to make various modifications to the described embodiment of the invention without departing from the true spirit and scope thereof. It is intended that all elements and steps which perform substantially the same function in substantially the same manner to achieve the same result are within the scope of the invention. For example, the DAC described could be used within an analog-to-digital converter (ADC).

What is claimed is:

1. In a CMOS digital-to-analog converter including a resistive voltage divider ladder network, a P-channel bit switch MOSFET having its drain connected to a terminal of a ladder resistor and its source connected to a first supply voltage conductor, and its gate connected to an output of a first driver, an N-channel bit switch MOSFET having its drain connected to the terminal of the ladder resistor, its source connected to receive a first reference voltage on a first reference voltage conductor, and its gate connected to the output of a second driver, bit switch adjustment circuitry for causing the on channel resistances of the P-channel and N-channel bit switch MOSFETs to be equal, the bit switch adjustment circuitry comprising in combination:
    (a) first circuit means for producing a second reference voltage on a second reference voltage conductor, the first driver including a first N-channel MOSFET having its source connected to the second reference voltage conductor and its drain connected to the output of the first driver; and
    (b) second circuit means responsive to the second reference voltage for producing a predetermined level of a monitor voltage at a monitor conductor when the second reference voltage has a value that causes the first driver output voltage to turn on the P-channel bit switch MOSFET so that its on channel resistance is equal to that of the on channel resistance of the N-channel bit switch MOSFET.

2. The bit switch adjustment circuitry of claim 1 wherein the first circuit means includes a trimmable resistor coupled between the first supply voltage conductor and the second reference voltage conductor to allow laser trimming of the trimmable resistor in response to the second circuit means until the predetermined level of the monitor voltage is produced.

3. The bit switch adjustment circuitry of claim 1 wherein the second circuit means includes:
    (a) a P-channel monitor MOSFET having its source connected to the first power supply voltage conductor and its gate connected to the second reference voltage conductor;
    (b) a first resistor having a first terminal connected to the drain of the P-channel monitor MOSFET and a second terminal connected to the monitor conductor;
    (c) an N-channel monitor MOSFET having its source connected to the first reference voltage conductor, and its gate connected to the first supply voltage conductor; and
    (d) a second resistor having a first terminal connected to the monitor conductor and a second terminal connected to the drain of the N-channel monitor MOSFET.

4. The bit switch adjustment circuitry of claim 3 including a conductive test pad connected to the monitor conductor to allow measurement of the monitor voltage and laser trimming of the trimmable resistor to cause the monitor voltage to assume the predetermined level.

5. The bit switch adjustment circuitry of claim 3 wherein the second circuit means includes third and fourth resistors connected between the first supply voltage conductor and the first reference voltage conductor, the first circuit means including differential amplifier means having one input connected to a junction between the first and second resistors, and a second input connected to a junction between the third and fourth resistors, the output of the differential amplifier means being connected to the second reference voltage conductor to thereby produce a value of the second reference voltage that causes the on channel resistance of the P-channel monitor MOSFET to equal the on channel resistance of the N-channel monitor MOSFET and thereby cause the on channel resistance of the P-channel bit switch MOSFET to equal the on channel resistance of the N-channel bit switch MOSFET.

6. The bit switch adjustment circuitry of claim 4 wherein the first circuit means further includes a second N-channel MOSFET having its source connected to a ground reference voltage conductor and its drain connected to one terminal of the laser trimmable resistor, and to the base of an NPN emitter follower transistor the emitter of which is connected to the second reference voltage conductor, the gate of the second N-channel MOSFET being connected to the gate and drain of a current mirror N-channel MOSFET the current to which is controlled in response to the first reference voltage.

7. The bit switch adjustment circuitry of claim 1 further including a first reference voltage circuit for producing the first reference voltage so that it is temperature invariant, the first reference voltage circuit including:
(a) first and second NPN transistors each having a base, a collector and an emitter, and means for connecting their bases together;
(b) means for producing different emitter current densities in the first and second NPN transistors to thereby produce different $V_{BE}$ voltages which have the same temperature variation;
(c) a first resistor which has zero temperature variation and a means for connecting the first resistor between the emitters of the first and second NPN transistors to thereby produce a first current which is temperature invariant through the first resistor;
(d) a second resistor which is temperature invariant connected between the base and emitter of the first NPN transistor, whereby the voltage across the second resistor, and hence a second current flowing through the second resistor, have a negative temperature variation that corresponds to a negative temperature variation of the $V_{BE}$ voltage of the first NPN transistor;
(e) a third resistor which is temperature invariant coupled between the base of the first NPN transistor and the first supply voltage conductor so that the second current flows through the third resistor, the voltage across the third resistor having the same temperature variation as the second current; and
(f) a fourth resistor having a positive temperature variation, coupled in series relationship with the third resistor between the base of the first transistor and the first supply voltage so that the second current flows through the fourth resistor, the magnitude of the positive per cent temperature variation of the fourth resistor exceeding the magnitude of the percent negative temperature variation of the second current, the positive temperature variation of the voltage across the fourth resistor being cancelled by the negative temperature variation of the voltage across the third resistor so that a reference voltage produced on the junction between the second and third resistors is temperature invariant.

8. The bit switch adjustment circuitry of claim 7 wherein the first reference voltage circuit further includes
a reference amplifier having a positive input that receives the temperature invariant reference voltage, the reference amplifier having an N-channel output MOSFET, a first bonding pad connected to a drain of the N-channel output MOSFET, a first feedback resistor coupled between the first supply voltage conductor and a negative input of the reference amplifier, and a second feedback resistor connected between the negative input of the reference amplifier and a second bonding pad;
a large output capacitor having one terminal wire bonded to the first supply voltage conductor and a second terminal wire bonded by a first bonding wire to the first bonding pad and bonded by a second bonding wire to the second bonding pad, the second terminal of the capacitor being connected to the first reference voltage conductor,
whereby the resistances of the first and second bonding wires do not create a zero at a frequency low enough to create instability of the reference amplifier and the large capacitor compensates the frequency response of the reference amplifier and absorbs current noise spikes on the first reference voltage conductor.

9. A circuit for producing a temperature invariant reference voltage, comprising in combination:
(a) first and second transistors each having a base, a collector and an emitter, and means for connecting their bases together;
(b) means for producing different emitter current densities in the first and second transistors to thereby produce different $V_{BE}$ voltages which have the same temperature variation;
(c) a first resistor which has zero temperature variation and a means for connecting the first resistor between the emitters of the first and second transistors to thereby produce a first current which is temperature invariant through the first resistor;
(d) a second resistor which is temperature invariant connected between the base and emitter of the first transistor, whereby the voltage across the second resistor, and hence a second current flowing through the second resistor, have a negative temperature variation that corresponds to a negative temperature variation of the $V_{BE}$ voltage of the first transistor;
(e) a third resistor which is temperature invariant coupled between the base of the first transistor and a supply voltage conductor so that the second current flows through the third resistor, the voltage across the third resistor having the same temperature variation as the second current; and
(f) a fourth resistor, coupled in series relationship with the third resistor between the base of the first transistor and the supply voltage so that the second current flows through the fourth resistor, the magnitude of the positive percent temperature variation of the fourth resistor exceeding the magnitude of the negative percent temperature variation of the second current, the positive temperature variation of the voltage across the fourth resistor being cancelled by the negative temperature variation of the voltage across the third resistor so that a reference voltage produced on the junction between the second and third resistors is temperature invariant.

10. The circuit of claim 9 wherein the first and second transistors are NPN transistors.

11. The circuit of claim 10 wherein the first resistor is composed of nichrome.

12. The circuit of claim 11 wherein the second resistor is composed of nichrome.

13. The circuit of claim 12 wherein the third resistor is composed of nichrome.

14. The circuit of claim 13 wherein the fourth resistor is composed of semiconductor material having a positive temperature variation.

15. The circuit of claim 14 including a fifth resistor composed of nichrome, a third transistor having its base connected to the emitter of the second transistor and to one terminal of the fifth resistor and its emitter connected to the other terminal of the fifth resistor and to the drain of an N-channel MOSFET having its source connected to a ground reference voltage conductor and its gate connected to the gate and drain electrodes of an N-channel current mirror MOSFET.

16. A method of adjusting the channel resistance of a bit switch in a digital-to-analog converting circuit, the bit switch including a P-channel bit switch MOSFET and an N-channel bit switch MOSFET, the drain of the N-channel bit switch MOSFET being connected to the drain of the P-channel bit switch MOSFET, the method comprising the steps of
(a) applying a first reference voltage by means of a first reference voltage conductor to a source of the N-channel bit switch MOSFET, and applying a supply voltage by means of a supply voltage conductor to the source of the P-channel bit switch MOSFET;
(b) generating a gate voltage for the P-channel bit switch MOSFET by means of a CMOS driver having a P-channel pull-up MOSFET having its source connected to the power supply voltage conductor and its drain connected to the gate of the P-channel bit switch MOSFET, the CMOS driver having an N-channel pull-down MOSFET with its drain connected to the gate of the P-channel MOSFET and its gate receiving a bit switch control signal;
(c) applying a second reference voltage by means of a second reference voltage conductor to the gate of a P-channel monitor MOSFET having its source connected to the supply voltage conductor, its gate connected to the source of the N-channel pull-down MOSFET, and its drain connected by means of a first resistor to a monitor conductor, the monitor conductor being connected by means of a second resistor to the drain of an N-channel monitor MOSFET having its gate connected to the supply voltage conductor and its source connected to the first reference voltage conductor, the ratio of the channel width-to-length ratio of the P-channel monitor MOSFET to the channel width-to-length ratio of the N-channel monitor MOSFET being equal to the ratio of the width-to-length ratio of the P-channel bit switch MOSFET to the width to length ratio of the N-channel bit switch MOSFET; and
(d) measuring a monitor voltage produced on the monitor conductor and varying the second reference voltage in response to the monitor voltage until the monitor voltage reaches a level at which the channel resistance of the P-channel monitor MOSFET is equal t the channel resistance of the N-channel monitor MOSFET, whereby the on channel resistance of the P-channel bit switch MOSFET precisely equals the on channel resistance of the N-channel bit switch MOSFET.

17. A method of providing a temperature invariant reference voltage, the method comprising the steps of:
(a) producing a first current;
(b) applying a $V_{BE}$ voltage of a first transistor across a first resistor the resistance of which is temperature invariant, and causing the first current to flow out of a first conductor connected to the emitter of the first transistor and one terminal of the first resistor, thereby causing a second current to flow through the first resistor, the second current having a negative temperature variation corresponding to a negative temperature variation of the $V_{BE}$ of the first transistor;
(c) causing the second current to simultaneously flow through second and third resistors which are connected in series between a supply voltage conductor and the base of the first transistor, one of the second and third resistors being connected to the supply voltage conductor and the other of the second and third resistors being connected to the base of the first transistor, the resistance of the second resistor being temperature invariant, the resistance of the third resistor having a positive per cent temperature variation the magnitude of which exceeds the negative per cent temperature variation of the second current,
the resistances of the second and third resistors having values that cause the temperature variation in the voltage drop across the third resistor to precisely cancel the temperature variation in the voltage drop across the second resistor, thereby producing a temperature invariant reference voltage on the base of the first transistor.

18. The method of claim 17 wherein step (a) includes producing the first current by applying a voltage equal to the difference between the $V_{BE}$ voltage of the first transistor and a $V_{BE}$ voltage of a second transistor having its base connected to the base of the first transistor across a temperature invariant fourth resistor, thereby causing the first current to flow through the fourth resistor.

19. A circuit for adjusting the channel resistance of a bit switch MOSFET in a digital-to-analog converting circuit, the bit switch including a P-channel bit switch MOSFET and an N-channel bit switch MOSFET, the drain of the N-channel bit switch MOSFET being connected to the drain of the P-channel bit switch MOSFET, the circuit comprising in combination:
(a) means for applying a first reference voltage on a first reference voltage conductor connected to a source of the N-channel bit switch MOSFET, and a supply voltage applied by means of a supply voltage conductor to the source of the P-channel bit switch MOSFET;

(b) means for generating a gate voltage for the P-channel bit switch MOSFET including a CMOS driver having a P-channel pull-up MOSFET having its source connected to the supply voltage conductor and its drain connected to the gate of the P-channel bit switch MOSFET, the CMOS driver having an N-channel pull-down MOSFET with its drain connected to the gate of the P-channel MOSFET and its gate receiving a bit switch control signal;

(c) means for applying a second reference voltage on a second reference voltage conductor connected to the source of the N-channel pull-down MOSFET and the gate of a P-channel monitor MOSFET having its source connected to the supply voltage conductor, and its drain connected by means of a first resistor to a monitor conductor, the monitor conductor being connected by means of a second resistor to the drain of an N channel monitor MOSFET having its gate connected to the supply voltage conductor and its source connected to the first reference voltage conductor, the ratio of the channel width-to-length ratio of the P-channel monitor MOSFET to the channel width-to-length ratio of the N-channel monitor MOSFET being equal to the ratio of the width-to-length ratio of the P-channel bit switch MOSFET to the width-to-length ratio of the N-channel bit switch MOSFET; and (d) means responsive to a monitor voltage produced on the monitor conductor for varying the second reference voltage in response to the monitor voltage until the monitor voltage reaches a level at which the channel resistance of the P-channel monitor MOSFET is equal to the channel resistance of the N-channel monitor MOSFET, whereby the on channel resistance of the P-channel bit switch MOSFET precisely equals the on channel resistance of the N-channel bit switch MOSFET.

20. A circuit for providing a temperature invariant reference voltage, the circuit comprising in combination:

(a) means for producing a first current;

(b) a first resistor the resistance of which is temperature invariant;

(c) means for applying a $V_{BE}$ voltage of a first transistor across the first resistor and causing a first current to flow out of a first conductor connected to the emitter of the first transistor and one terminal of the first resistor, thereby causing a second current to flow through the first resistor, the second current having a negative temperature variation corresponding to a negative temperature variation of the $V_{BE}$ of the first transistor;

(d) second and third resistors connected in series between a supply voltage conductor and the base of the first transistor, one of the second and third resistors being connected to the supply voltage conductor and the other of the second and third resistors being connected to the base of the first transistor, the resistance of the second resistor being temperature invariant, the resistance of the third resistor having a positive per cent temperature variation the magnitude of which exceeds the magnitude of the percent temperature variation of the second current; and (e) means for causing the second current to simultaneously flow through the second and third resistors, the resistances of the second and third resistors having values that cause the per cent temperature variation in the voltage drop across the third resistor to precisely cancel the percent temperature variation in the voltage drop across the second resistor, thereby producing a temperature invariant reference voltage on the base of the first transistor.

21. The circuit of claim 20 wherein the first current producing means includes a second transistor having its base connected to the base of the first transistor and a temperature invariant fourth resistor connected between the emitters of the first and second transistors and thereby applying a voltage equal to the difference between the $V_{BE}$ voltage of the first transistor and a $V_{BE}$ voltage of the second transistor across the fourth resistor and thereby causing the temperature invariant constant first current to flow through the fourth resistor.

22. A multiple mode digital-to-analog converter comprising in combination:

(a) data input means for receiving in serial format data words which can be alternate right channel and left channel data words;

(b) shift register means for receiving and shifting the right channel and left channel data words from the data input means into the shift register means;

(c) latch means for receiving the data word presently in the shift register means after that entire data word has been shifted into the shift register means;

(d) resistive ladder network means for receiving outputs of the latch means to convert the digital word presently in the latch means into a corresponding analog voltage;

(e) first and second amplifiers each having a first input;

(f) first and second gating circuit means for gating the present analog voltage to the first inputs of the first and second amplifiers in response to first and second mode control signals, respectively;

(g) first mode control means responsive to a first mode selection signal for
 (1) producing the first mode control signal to gate the present analog voltage to the first input of the first amplifier after the right channel data word has been loaded from the shift register means into the latch means and converted by the resistive ladder network means to the present analog voltage,
 (2) generating the second mode control signal to gate the analog voltage to the first input of the second amplifier after the left channel data word has been loaded from the shift register means into the latch means and converted by the resistive ladder network means to the present analog voltage;

(h) second mode control means responsive to a second mode selection signal for generating the first mode control signal to gate the present analog voltage to the first input of the first amplifier after the right channel data word has been loaded into the latch means from the shift register means and converted by the resistive ladder network mean to the present analog voltage and after a delay long enough to allow the following left channel data word to be loaded into the latch means from the shift register means and converted by the resistive ladder network means into another present analog voltage;

(i) third mode control means responsive to a third mode selection signal for producing the first mode control signal to gate the present analog voltage to the first input of the first amplifier after the left channel data word has been loaded from the shift register means into the latch means and converted by the resistive ladder network means to the present analog voltage.

23. The multiple mode digital-to-analog converter of claim 22 wherein the second mode control means and third mode control means together produce an inhibit signal, and together include means for inhibiting the second amplifier in response to the inhibit signal.

24. The multiple mode digital-to-analog converter of claim 22 wherein the first and second amplifiers each have a second input, the multiple mode digital-to-analog converter including means for applying a reference voltage to the second inputs of the first and second amplifiers, and means for holding an input of the first gating means at the reference voltage while the present analog voltage is not being gated to the input of the first amplifier, and means for holding an input of the second gating means at the reference voltage while the present analog voltage is not being gated to the first input of the second amplifier

* * * * *